(12) United States Patent
Hartman et al.

(10) Patent No.: US 10,154,605 B1
(45) Date of Patent: Dec. 11, 2018

(54) FASTENER ALIGNMENT FOR SPLIT CHASSIS ASSEMBLY

(71) Applicant: Dell Products, L.P., Round Rock, TX (US)

(72) Inventors: Corey Hartman, Hutto, TX (US); Salvador Jimenez, Cedar Park, TX (US); Yu-Feng Lin, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 15/617,330

(22) Filed: Jun. 8, 2017

(51) Int. Cl.
*H05K 5/02* (2006.01)
*H05K 7/14* (2006.01)

(52) U.S. Cl.
CPC ......... *H05K 7/1489* (2013.01); *H05K 5/0217* (2013.01); *H05K 7/1411* (2013.01)

(58) Field of Classification Search
CPC .................................................. H05K 5/0217
USPC ................................................. 361/724–728
See application file for complete search history.

(56) References Cited

U.S. PATENT DOCUMENTS

| | | | | |
|---|---|---|---|---|
| 4,713,714 A * | 12/1987 | Gatti | ...................... | G11B 33/08 248/581 |
| 5,823,644 A * | 10/1998 | Suh | .......................... | G06F 1/181 312/223.2 |
| 6,052,274 A * | 4/2000 | Remsburg | ............. | F16B 19/109 361/679.58 |
| 6,799,980 B2 * | 10/2004 | Bloomfield | .............. | H01R 4/66 439/92 |
| 7,364,442 B2 * | 4/2008 | Bang | .................... | H05K 1/0215 411/522 |
| 2002/0051338 A1 * | 5/2002 | Jiang | ......................... | G06F 1/20 361/679.36 |
| 2003/0222555 A1 * | 12/2003 | Mansueto | ............... | G06F 1/184 312/330.1 |
| 2005/0190546 A1 * | 9/2005 | Chen | ..................... | H05K 7/1402 361/807 |
| 2006/0114662 A1 * | 6/2006 | Liu | ......................... | H05K 7/142 361/759 |
| 2009/0046438 A1 * | 2/2009 | Maeda | ............... | H05K 7/20509 361/756 |
| 2009/0073651 A1 * | 3/2009 | Hu | .......................... | G06F 1/184 361/679.58 |
| 2014/0104766 A1 * | 4/2014 | Clayton | ................. | G06F 1/183 361/679.02 |

* cited by examiner

*Primary Examiner* — Adrian S Wilson
(74) *Attorney, Agent, or Firm* — Fogarty LLP

(57) ABSTRACT

A modular IHS (Information Handling System) chassis system includes a first module and a second module. An alignment pin is fixed to the sidewall of the first module. An alignment slot is cut from the corresponding sidewall of the second module. The second module also includes a retaining mechanism that receives the alignment pin during assembly of the first module and the second module. The retaining mechanism locks the alignment pin into a seated position in the first alignment slot, thus preventing separation of the first module and second module during the assembly process. The retaining mechanism may be a retaining plate that includes upper and lower protrusions that extend into the alignment slot and lock the alignment pin in place. The retaining mechanism may also be a latch that opens by pushing the alignment pin into the alignment slot and closes to lock the alignment pin in place.

20 Claims, 7 Drawing Sheets

FASTENER ALIGNMENT FOR SPLIT CHASSIS ASSEMBLY

FIELD

This disclosure relates generally to the assembly of an Information Handling System (IHS), and more specifically, to the alignment of chassis components of the IHS during its assembly.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

An IHS may be physically constructed of a chassis that houses the various electronic components of the IHS. The chassis of an IHS may be a modular structure that is constructed from multiple pieces of sheet metal that are fastened together using screws, clips and various other attachment mechanism. During manufacture of an IHS constructed from a modular chassis, the various chassis modules may be placed on an assembly table where they are pushed together and fastened. Proper alignment of the modular chassis components during this assembly process is crucial. In many cases, once the module components appear to be aligned on an assembly table, screws are used to permanently fasten the modular components of the chassis together. However, due to inherent tolerances of sheet metal manufacturing, and imperfections and non-uniformity in the assembly table work surface, relatively small degrees of misalignment between the modular components must be overcome. If the small degrees of misalignment are not tolerated by the design, manufacturing errors can occur, including issues such as inadvertent cross-threading of the screws used to fasten the modular components together, or inability to install screws into the required fastener locations. The misaligned chassis components are now fastened incompletely with cross-threaded screws. In some scenarios, the chassis components may be structurally sound despite the cross-threading of the screws, but may nonetheless result in the chassis being misshapen, and not within design specifications of the intended use case. Additional permanent damage to the chassis, and potentially to elements of the enclosure of the IHS and to the electronic components that are fastened to the chassis, may result as the misshapen chassis continues in the assembly process. In other scenarios, the cross-threading of the screws may result in damage to the threads that is sufficient to result in failure of this attachment point, thus allowing movement of the chassis components.

SUMMARY

In various embodiments, an IHS (Information Handling Systems) constructed from a modular chassis including: a first module of the modular chassis, wherein the first module comprises an alignment pin that is fixed to the sidewall of the first module and that extends inwards into the modular chassis; and a second module of the modular chassis, wherein the second module comprises a first alignment slot cut from the sidewall corresponding to the alignment pin, and wherein the second module further comprises a retaining mechanism that is fixed to the corresponding sidewall of the second module, and wherein the retaining mechanism receives the alignment pin during assembly of the first module and the second module, and wherein the retaining mechanism locks the alignment pin into a seated position in the first alignment slot.

In certain additional IHS embodiments, the locking of the alignment pin by the retaining mechanism aligns corresponding assembly holes in the sidewall of the first module and the sidewall of the second module. In certain additional IHS embodiments, the locking of the alignment pin by the retaining mechanism allows the installation of fasteners in the aligned assembly holes of the first module and the second module. In certain additional IHS embodiments, retaining mechanism comprises a retaining plate that comprises a second alignment slot that corresponds with the first alignment slot, and wherein the retaining plate comprises upper and lower protrusions that extend into the second alignment slot. In certain additional IHS embodiments, the upper and lower protrusions allow the alignment pin to be pushed into the seated position in the first alignment slot, and wherein the upper and lower protrusions lock the alignment pin in the seated position. In certain additional IHS embodiments, the retaining mechanism comprises a latch that allows the alignment pin to be pushed into the seated position in the first alignment slot and locks the alignment pin in the seated position. In certain additional IHS embodiments, the latch comprises an angled lower face that opens the latch as the alignment pin is pushed into the first alignment slot.

In various embodiments, a modular chassis system includes a first module comprising an alignment pin that is fixed to the sidewall of the first module; and a second module comprising a first alignment slot cut from the sidewall corresponding to the alignment pin, and wherein the second module further comprises a retaining mechanism that is fixed to the corresponding sidewall of the second module, and wherein the retaining mechanism receives the alignment pin during assembly of the first module and the second module, and wherein the retaining mechanism locks the alignment pin into a seated position in the first alignment slot.

In certain additional modular chassis system embodiments, the locking of the alignment pin by the retaining mechanism aligns corresponding assembly holes in the sidewall of the first module and the sidewall of the second module. In certain additional modular chassis system embodiments, the locking of the alignment pin by the retaining mechanism allows the installation of fasteners in the aligned assembly holes of the first module and the second module. In certain additional modular chassis system embodiments, the retaining mechanism comprises a retaining plate that comprises a second alignment slot that corresponds with the first alignment slot, and wherein the retaining plate comprises upper and lower protrusions that extend into the second alignment slot. In certain additional modular chassis system embodiments, the upper and lower protrusions allow the alignment pin to be pushed into the seated position in the first alignment slot, and wherein the upper and lower protrusions lock the alignment pin in the seated position. In certain additional modular chassis system embodiments, the retaining mechanism comprises a latch that allows the alignment pin to be pushed into the seated position in the first alignment slot and locks the alignment pin in the seated position. In certain additional modular chassis system embodiments, the latch comprises an angled lower face that opens the latch as the alignment pin is pushed into the first alignment slot.

In various embodiments, a method for assembly of an IHS (Information Handling Systems) constructed from a modular chassis includes: attaching a first module of the modular chassis to a second module of the modular chassis, wherein the first module comprises an alignment pin that is fixed to the sidewall of the first module and that extends inwards into the modular chassis, and wherein the second module comprises a first alignment slot cut from the sidewall corresponding to the alignment pin, and wherein the second module further comprises a retaining mechanism that is fixed to the corresponding sidewall of the second module, and wherein the attaching comprises: receiving, by the retaining mechanism, the alignment pin during assembly of the first module and the second module; and locking, by the retaining mechanism, the alignment pin into a seated position in the first alignment slot.

In certain additional method embodiments, the locking of the alignment pin by the retaining mechanism aligns corresponding assembly holes in the sidewall of the first module and the sidewall of the second module, and wherein the locking of the alignment pin by the retaining mechanism allows the installation of fasteners in the aligned assembly holes of the first module and the second module. In certain additional method embodiments, the retaining mechanism comprises a retaining plate that comprises a second alignment slot that corresponds with the first alignment slot, and wherein the retaining plate comprises upper and lower protrusions that extend into the second alignment slot. In certain additional method embodiments, the upper and lower protrusions allow the alignment pin to be pushed into the seated position in the first alignment slot, and wherein the upper and lower protrusions lock the alignment pin in the seated position. In certain additional method embodiments, the retaining mechanism comprises a latch that allows the alignment pin to be pushed into the seated position in the first alignment slot and locks the alignment pin in the seated position. In certain additional method embodiments, the latch comprises an angled lower face that opens the latch as the alignment pin is pushed into the first alignment slot.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an IHS may be a personal computer, a PDA, a consumer electronic device, a network storage device, a network router, a network video camera, a data recording device used to record physical measurements in a manufacturing environment, or any other suitable device and may vary in size, shape, performance, functionality, and price. The IHS may include memory, one or more processing resources, e.g., a central processing unit (CPU) or hardware or software control logic. Additional components or the IHS may include one or more storage devices, one or more communications ports for communicating with external devices as well as various input and output (I/O) devices, e.g., a keyboard, a mouse, and a video display. The IHS may also include one or more buses operable to transmit communication between the various hardware components.

Figure 1:
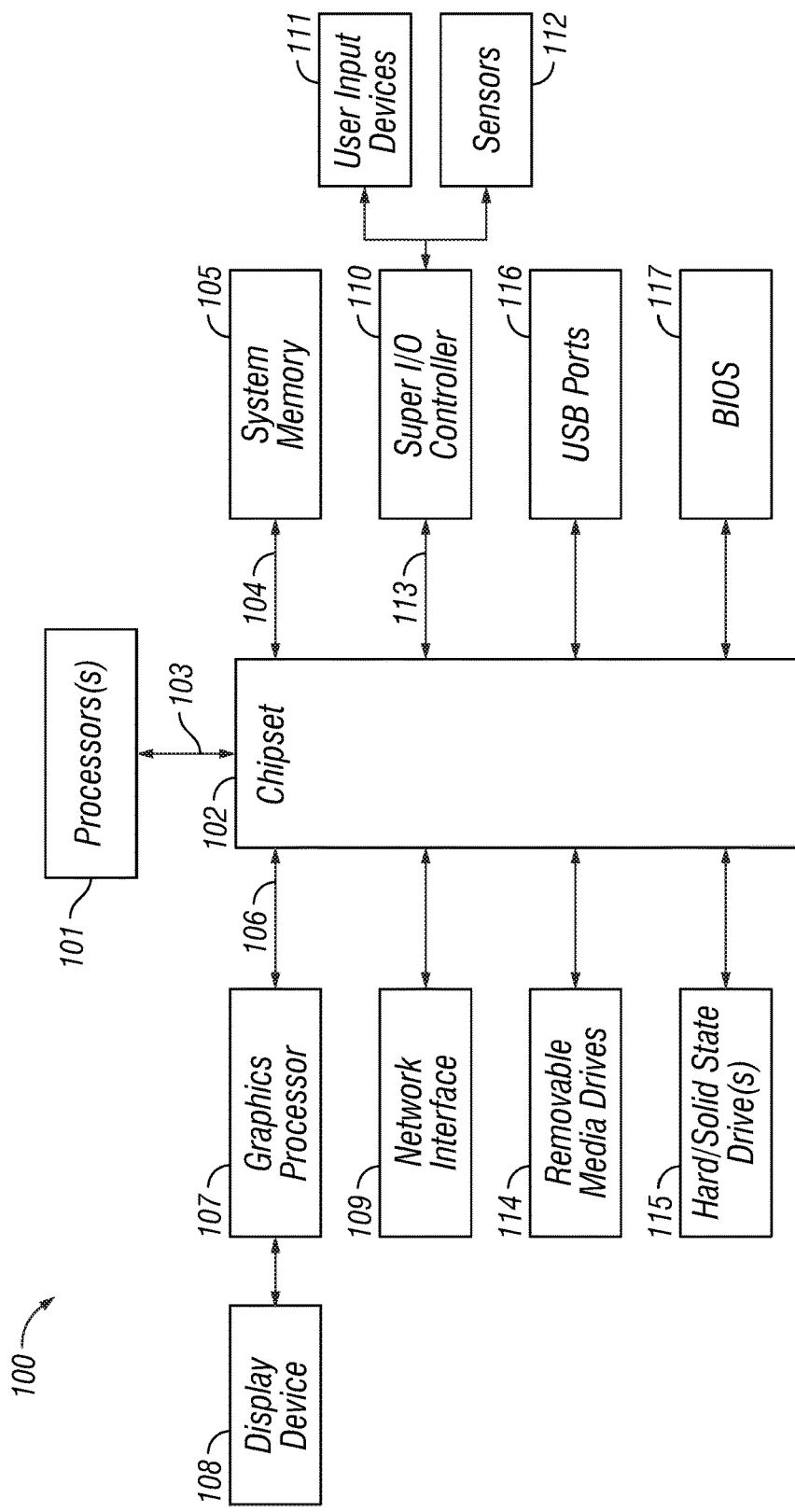
FIG. 1 is a block diagram depicting certain components of an IHS according to various embodiments.

FIG. 1 is a block diagram of an IHS 100 configured according to certain embodiments. IHS 100 may include one or more processors 101. In various embodiments, IHS 100 may be a single-processor system including one processor 101, or a multi-processor system including two or more processors 101. Processor(s) 101 may include any processor capable of executing program instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

IHS 100 includes a memory I/O hub chipset 102 comprising one or more integrated circuits that connect to processor(s) 101 over a front-side bus 103. Chipset 102 provides the processor(s) 101 with access to a variety of resources. For instance, chipset 102 provides access to system memory 105 over memory bus 104. System memory 105 may be configured to store program instructions and/or data accessible by processors(s) 101. In various embodiments, system memory 105 may be implemented using any suitable memory technology, such as static RAM (SRAM), synchronous dynamic RAM (SDRAM), nonvolatile/Flash-type memory, or any other type of memory.

Chipset 102 may also provide access to a graphics processor 107. In certain embodiments, graphics processor 107 may be comprised within one or more video or graphics cards that have been installed on IHS 100. Graphics processor 107 may be coupled to the chipset 102 via a graphics bus 106 such as provided an AGP (Accelerated Graphics Port) bus or a PCI (Peripheral Component Interconnect or) bus. In certain embodiments, graphics processor 107 generates display signals and provides them to a coupled display device 108.

In certain embodiments, chipset 102 may also provide access to one or more user input devices 111. In such embodiments, chipset 102 may be coupled to a super I/O controller 110 that provides interfaces for variety of user input devices 111, in particular lower bandwidth and low data rate devices. For instance, chipset 110 may provide access to a keyboard and mouse or other peripheral input devices. In certain embodiments, chipset 110 may be used to interface with coupled user input devices 111 such as keypads, biometric scanning devices, and voice or optical recognition devices. In certain embodiments, super I/O controller 110 may also provide an interface for communication with one or more sensor devices 112, which may include environment sensors, such as a temperature sensor or other cooling system sensor. The I/O devices, such as the user input devices 111 and the sensor devices 112, may interface super I/O controller 110 through wired or wireless connections. In certain embodiments, the super I/O controller 110 may be coupled to the super I/O controller 110 via a Low Pin Count (LPC) bus 113.

Other resources may also be coupled to IHS 100 through the chipset 102. In certain embodiments, chipset 102 may be coupled to a network interface 109, such as provided by a Network Interface Controller (NIC). According to various embodiments, network interface 109 may support communication via various wired and/or wireless networks. Chipset 102 may also provide access to one or more hard disk and/or solid state drives 115. In certain embodiments, access may be provided to a removable-media drive 114, such as an optical disc drive. Any or all of the drive devices 114 and 115 may be integral to the IHS 100, or may be located remotely from the IHS 100. In certain embodiments, access may be provided to one or more Universal Serial Bus (USB) ports 116.

Another resource that may be accessed by processor(s) 101 via chipset 102 is BIOS 117. The BIOS 117 provides an abstraction layer for interfacing with certain hardware components that are utilized by IHS 100. Via this hardware abstraction layer provided by BIOS 117, the software executed by the processor(s) 101 of IHS is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI. Upon booting of the IHS 100, processor(s) 101 may utilize BIOS 117 instructions to initialize and test hardware components coupled to the IHS and to load an Operating System (OS) for use by the IHS 100.

Not all IHSs 100 include each of the components shown in FIG. 1, and other components not shown may exist. Furthermore, some components shown as separate may exist in an integrated package or be integrated in a common integrated circuit with other components. For example, several of the resources provided via chipset 102 may instead be integrated into the one or more processor(s) 101 as a system-on-a-chip.

Figure 2A:
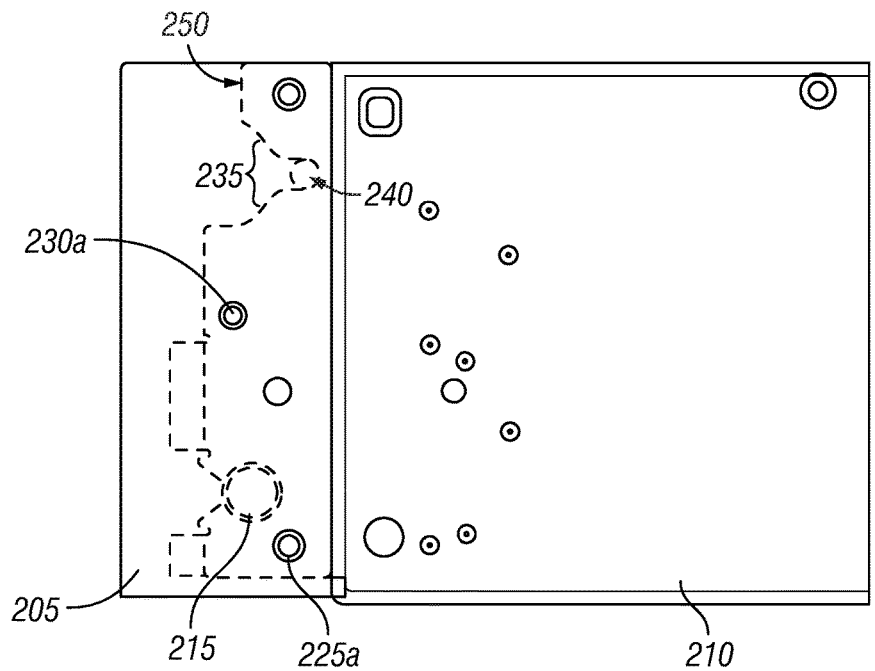
FIG. 2a is an illustration depicting correctly aligned components of a modular chassis of an IHS.

As described, an IHS may include a modular or multi-piece chassis that is constructed from the permanent fastening of two or more chassis components. FIG. 2a is an illustration depicting portions of a modular IHS chassis that are joined together. The various modules of the chassis may be formed from sheet metal, aluminum or another lightweight metal, thermoplastic or composite suitable for construction of the internal framework of an IHS. FIG. 2a depicts two modules 205 and 210 of a modular chassis of an IHS. On the left side of FIG. 2a, a sidewall of a first chassis module 205 is illustrated. The first chassis module 205 may house various electronic components and systems of the IHS. On the right side, a sidewall of a second chassis module 210 is illustrated. The second chassis module 210 may likewise house various electronic systems and components. Once the left chassis module 205 and the right chassis module 210 are mated and fastened together, certain electronic systems and components housed within the two modules may be connected. Additional chassis modules may be fastened to the left chassis module 205 and the right chassis module 210 to form the complete chassis of the IHS.

The chassis of the IHS may be assembled by placing the left chassis module 205 and the right chassis module 210 on an assembly table. The left chassis module 205 and the right module 210 may then be pushed towards each other along the assembly table until the two chassis modules are positioned such that they may be permanently attached together using screws. As illustrated by the dashed portion 250 of right chassis module 210, the right chassis module 210 includes a recessed offset 250 that slides inside of the left module 205 to form an offset lip joint between the overlapping portions of the two modules. Also illustrated in FIG. 2a are aligned assembly holes 225a and 230a. When correctly aligned, as shown in FIG. 2a, these assembly holes 225a and 230a traverse through the overlapping offset lip joint portions of both the left chassis module 205 and the right chassis module 210. The assembly holes 225a and 230a may be designed to receive screws, and thus may be threaded. By installing screws in the aligned assembly holes 225a and 230a, the left chassis module 205 and the right chassis module 210 may be permanently fastened together and the assembly of the IHS may then be continued.

In order to align the left chassis module 205 and the right chassis module 210 during assembly of the chassis, the right chassis module 210 includes alignment slots that correspond to alignment pins provided by the left chassis module 205.

In the illustrated chassis modules, the right chassis module 210 includes an upper alignment slot 235 that is cut from the offset portion 250 of the sidewall that slides inside of the sidewall of the left chassis module 205. This upper alignment slot 235 of the right chassis module 210 receives an alignment pin 240 that is fixed to the corresponding sidewall of the left chassis module 205. The right chassis module 210 also includes a second, lower alignment slot 220 that is likewise cut from the offset portion 250 of the sidewall and that receives a second alignment pin 215 that is fixed to the sidewall of the left chassis module 205. During assembly of a modular IHS chassis, the left chassis module 205 and the right chassis module 210 may be pushed together along the assembly table until the alignment pins 215 and 240 enter the respective alignment slots 235 and 220 and reach seated positions in the respective alignment slots 235 and 220.

Figure 2B:
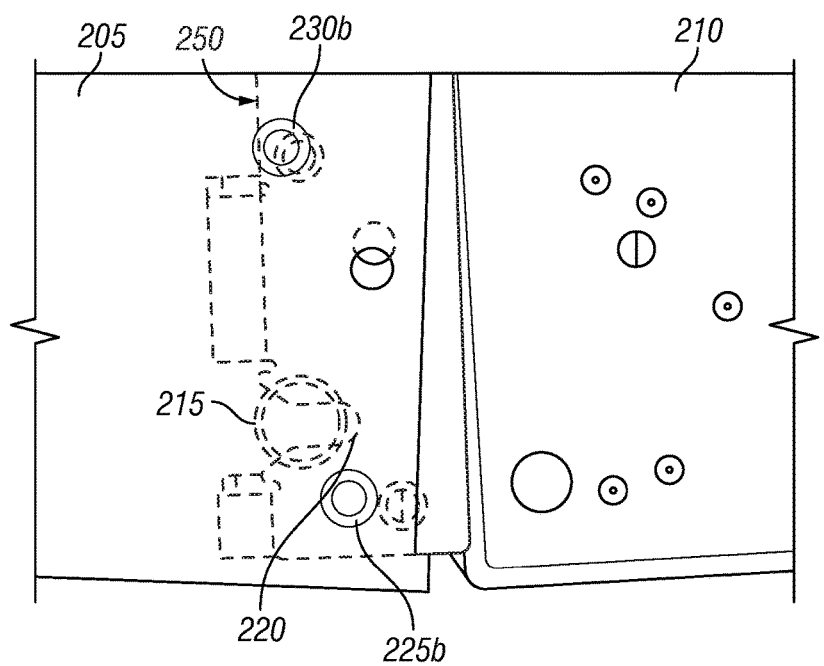
FIG. 2b is an illustration depicting misaligned components of a modular chassis of an IHS.

If the alignment pins 215 and 240 are correctly seated within the respective alignment slots 235 and 220, the assembly holes 225a and 230a that traverse the overlapping lip joint portions of the sidewalls of the left chassis module 205 and right chassis module 210 will be correctly aligned. However, certain conditions may exist, such as an imperfect assembly surface or incorrect assembly procedures by the builder, that may result in the misaligned left chassis module 205 and the right chassis module 210 illustrated in FIG. 2b. In the illustrated scenario, the left chassis module 205 has rotated about the top alignment pin 240 such that the lower alignment pin 215 has moved from its seated position within alignment slot 220. Such a scenario may occur if the assembly table on which the chassis is being built is not sufficiently flat. For instance, if the assembly table is curved, warped, bowed, bent or otherwise uneven, the left chassis module 205 may be displaced upwards relative to the right chassis module 210, as illustrated in FIG. 2b. Other scenarios may resulted in the right chassis module 210 being similarly rotated away from the left chassis module.

Misalignment of the chassis modules may also occur if a foreign object, such as a screw or other fastener, is inadvertently left on the assembly table such that one of the two chassis modules 205 or 210 is placed on top of the foreign object, thus resulting in a displacement such as illustrated in FIG. 2b if the left chassis module 205 were to be placed on top of the foreign object. In some scenarios, the two chassis modules 205 and 210 may be initially mated correctly, such as illustrated in FIG. 2a, but may become displaced, by gravity or human interaction, such as illustrated in FIG. 2b, prior to permanent fastening of the two chassis modules via installation of screws into the assembly holes.

Figure 3A:
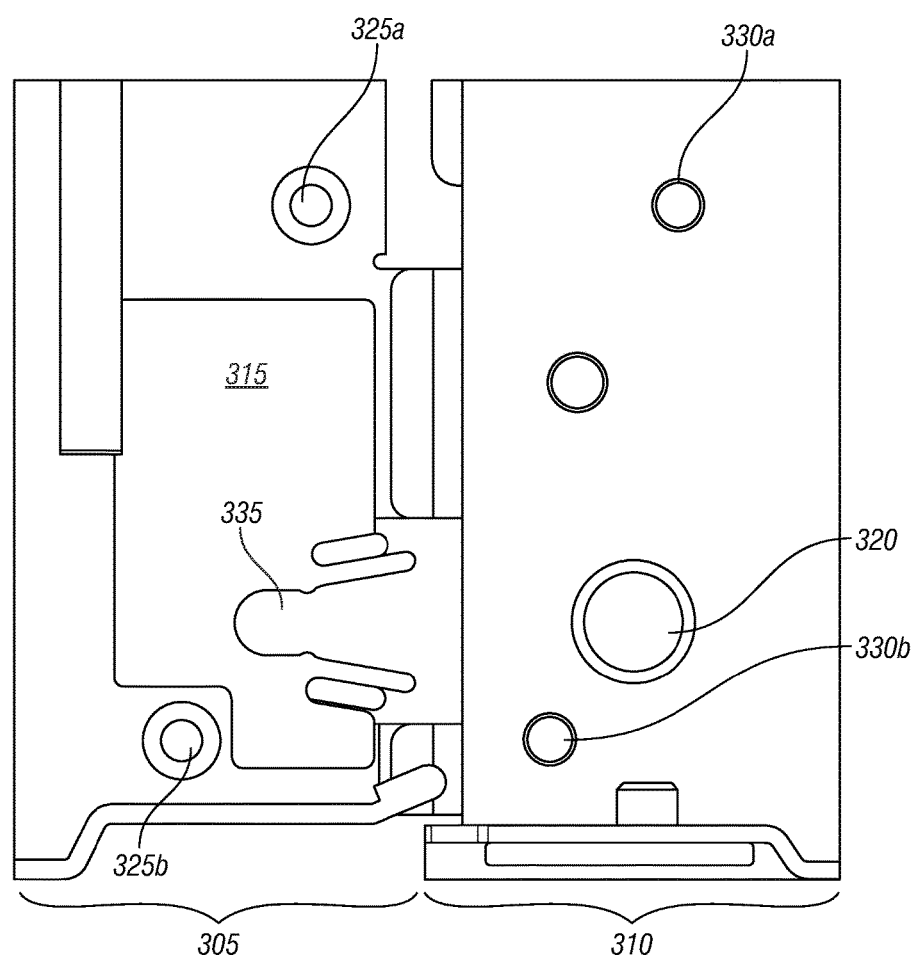
FIG. 3a is an illustration of modular chassis components in a dis-assembled state, where one modular chassis component includes a retaining plate and another modular chassis component includes an alignment pin, where the retaining plate and alignment pin may be utilized according to various embodiments for the alignment and retention of the modular chassis components.

As illustrated in FIG. 2b, the misalignment between the left chassis module 205 and the right chassis module 210 may result in the displacement of the recessed offset 250 of the right chassis module 210 such that the intended offset lip joint between the overlapping sidewall portions of the two chassis modules 205 and 210 is no longer correctly formed. In some scenarios, this displacement may be relatively small, such that build personnel may have difficulty detecting the misalignment between the two chassis modules 205 and 210. As illustrated, the displacement of the two chassis modules 205 and 210 results in a misalignment of the assembly holes 230b and 225b of the left chassis module 205 with the assembly holes of the right chassis module 210. In some scenarios, build personnel may still be able to install screws into the assembly holes 230b and 225b despite the misalignment. This may result in cross-threading of the screws in the assembly holes 230b and 225b. In some cases, the resulting damages to the threads of the screws and or assembly holes may result in failure of this attachment point. Due to damage to the threads of the assembly holes 230b and 225b, the chassis may permanently damaged and potentially ruined and scrapped FIG. 3a is an illustration of retaining plate 315 for alignment of modular IHS chassis components according to various embodiments, where the retaining plate 315 is attached to the sidewall of the a left chassis module 305. Similar to FIGS. 2a-b, the chassis is constructed from a left chassis module 305 and a right chassis module 310. The right chassis module 310 includes an alignment pin 320 that protrudes from the sidewall of the right chassis module and into the interior of the IHS chassis. The alignment pin 320 is permanently attached to the right chassis module 310 in a fixed position. The alignment pin 320 of the right chassis module 310 is designed to mate with the retaining plate 315 that is attached to the corresponding sidewall of the left chassis module 305. The left chassis module 305 includes assembly holes 325a and 325b that are configured to align with the assembly holes 330a and 330b of the right chassis module 310 when these two chassis module components are properly aligned with each other and mated together during the assembly process.

Figure 3B:
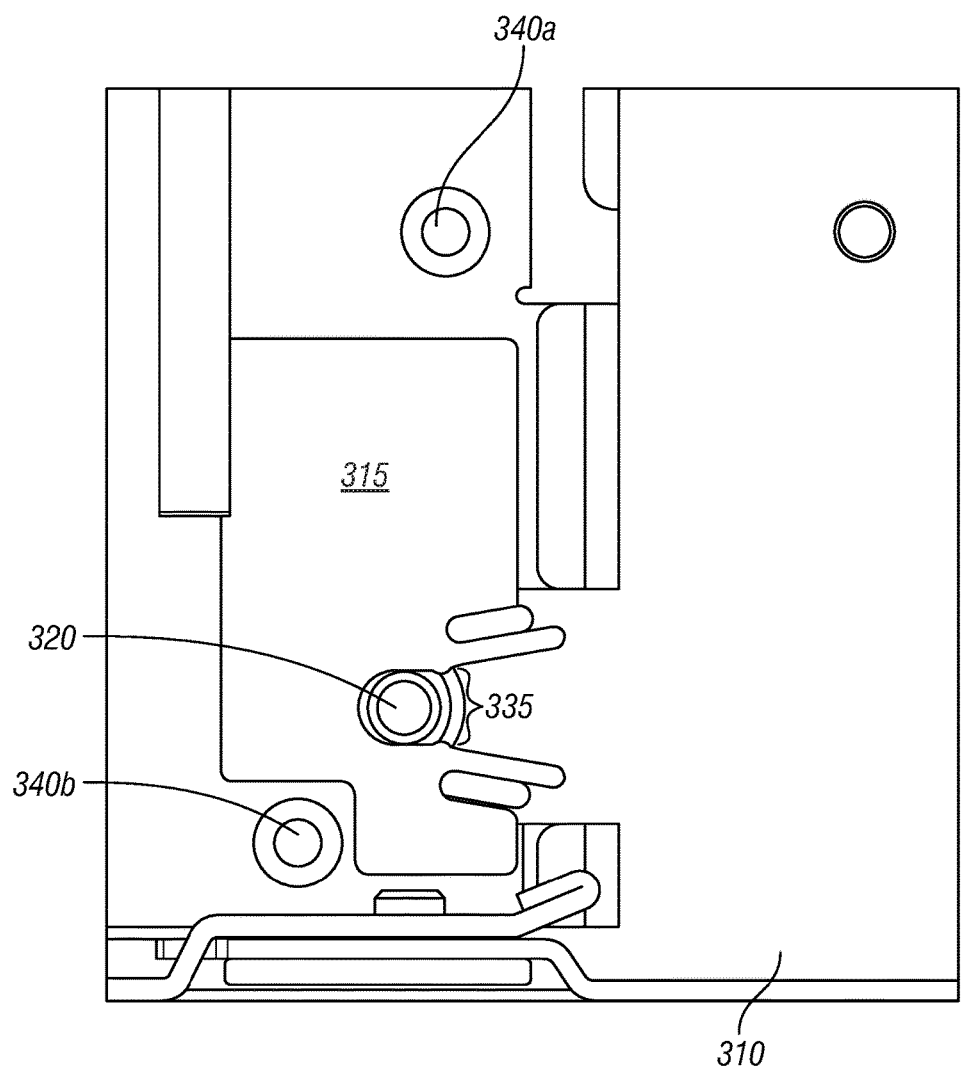
FIG. 3b is an illustration of modular chassis components in an assembled state, where one modular chassis component includes a retaining plate and another modular chassis component includes an alignment pin, where the retaining plate and alignment pin are utilized for the alignment and retention of the assembled modular chassis components according to various embodiments.

As illustrated, the retaining plate 315 includes a slot 335 that coincides with a corresponding slot cut from the sidewall of the left chassis module 305 such that the slot 335 may receive the alignment pin 320. During assembly, the left chassis module 305 and the right chassis module 310 may be placed on an assembly table and pushed together by build personnel until the alignment pin 320 slides into the slot 335 of the retaining plate 315. FIG. 3b is an illustration of the left chassis module 305 coupled together with the right chassis module 310, where the coupling of the two chassis modules is achieved through the mating of the alignment pin 320 within the slot 335 of the retaining plate 315. As illustrated, when properly aligned and mated, the assembly holes 340a and 340b of the left chassis module 305 and the right chassis module 310 are correctly aligned. Installation of screws in the aligned assembly holes 340a and 340b serves to permanently fasten the left chassis module 305 and the right chassis module 310 together via an offset lip joint of the sidewall, such as described with regard to FIGS. 2a-b. The correct alignment of the assembly holes 340a and 340b allows screws to be installed in the assembly holes without cross threading.

As described with regard to FIGS. 2a-b, various factors, such as a non-flat assembly table, may result in misalignment of modular chassis components during their assembly. Such misalignment may result from the alignment pin 320 sliding out of its seated position in the slot 335 of the retaining plate 315. However, as illustrated in the close-up illustration of the retaining plate 315 in FIG. 3c, the retaining plate 315 may be configured according to various embodiments with upper and lower protrusions 345 that extend into the slot 335 of the retaining plate. During assembly, the right chassis module 310 may be pushed along the assembly table towards the left chassis module 305 until the alignment pin 320 contacts the upper and lower protrusions 345 of the retaining plate 315. At this point, the builder may apply additional force on one or both of the chassis modules in order to push the alignment pin 320 past the upper and lower protrusions 345 until the alignment pin 320 is in its seated position within the slot 335 of the retaining plate 315.

Figure 3C:
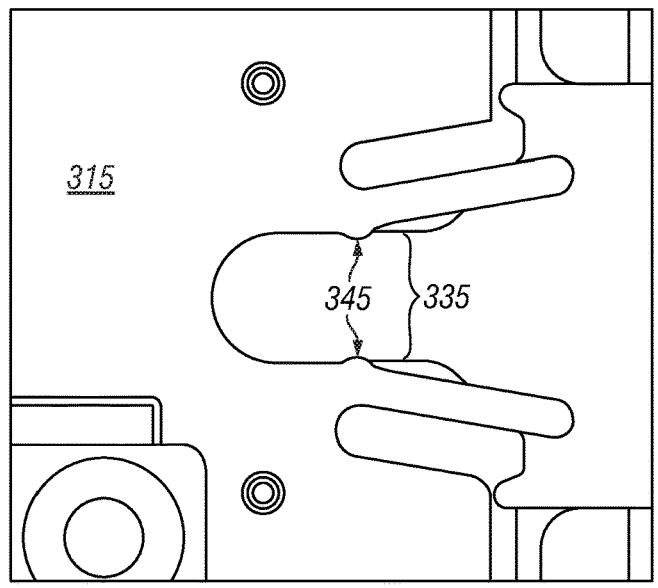
FIG. 3c is a magnified illustration of a retaining plate for retention of a modular chassis components utilizing an alignment pin according to various embodiments.

As illustrated in FIG. 3c, the retaining plate 315 includes two protrusions 345 that extend into the slot 335 that receives the alignment pin 320. In certain embodiments the retaining plate 315 may be formed from a plastic or other polymer material and may be permanently attached to the side wall of the left chassis module 305. The upper and lower protrusions 345 may be formed from the same material as the retaining plate 315. In certain embodiments, the upper and lower protrusions 345 may be formed from an elastomer or other deformable material and subsequently attached to the retaining plate 315. The size, shape, and material used for the construction of the upper and lower protrusions 345 may be selected such that the retaining plate 315 can receive the alignment pin 320 and allow a builder, using a moderate amount of force, to push the alignment pin 320 past the upper and lower protrusions 345 and into a seated position within the slot 335 of the retaining plate 315. Once the alignment pin 320 has been pushed into a seated position, the upper and lower protrusions 345 lock the alignment pin 320 in this seated position, thus locking the left chassis module 305 and the right chassis module 310 together, which maintains chassis coplanarity and chassis hole 340a-b alignment. The retaining plate 315 provides retention of alignment pin 320 sufficient to withstand the forces caused by deviations in the flatness of the assembly table that would otherwise unseat pin 320. Wth the aligned chassis modules locked together in this fashion, the builder can install the screws that will permanently fix the two modules together along the offset lip joint.

Figure 4A:
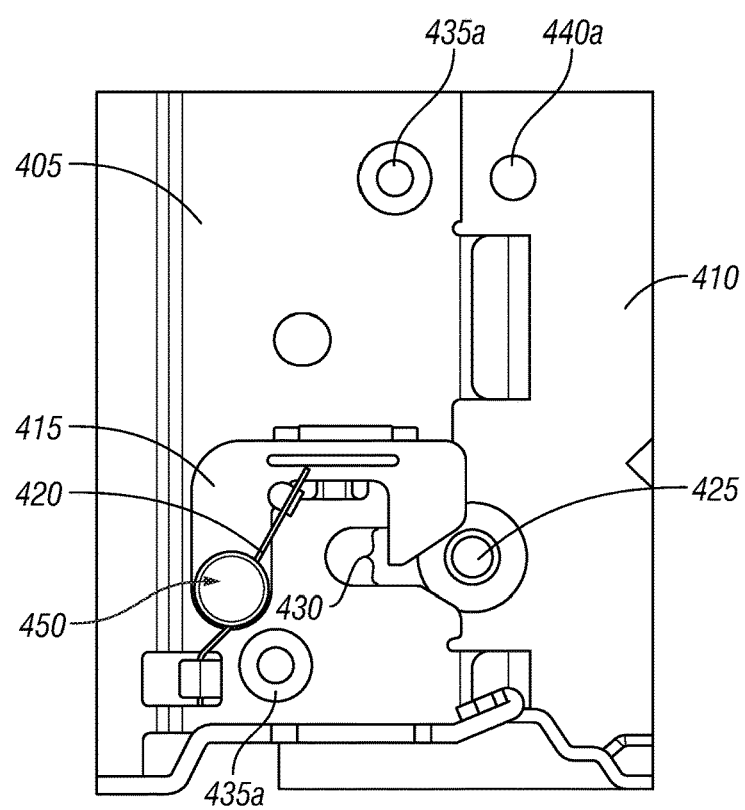
FIG. 4a is an illustration of modular chassis components in an un-assembled state, where the modular chassis components may utilize a latch for retention and alignment according to various embodiments.
Figure 4B:
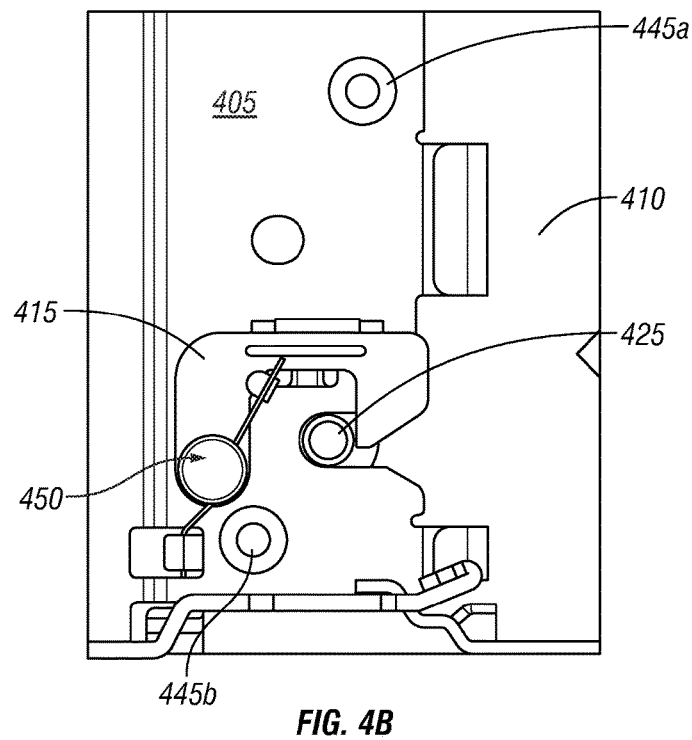
FIG. 4b is an illustration of modular chassis components in an assembled state, where the modular chassis components are assembled using a latch mated with an alignment pin according to various embodiments.

FIGS. 4a-b are illustrations of another embodiment for aligning and securing two modular components of an IHS chassis during the assembly of the chassis. In the embodiment of FIG. 4a, the sidewall of the left chassis module 405 is being aligned and attached to the sidewall of the right chassis module 410. As with the embodiments of FIGS. 3a-c, the left chassis module 405 includes assembly holes 435a that align with the corresponding assembly holes 440a of the right chassis module 410. As illustrated in FIG. 4b, the sidewall of the left chassis module 405 and the sidewall of the right chassis module 410 may be pushed together until the aligned assembly holes 445a-b of the overlapping portions of the sidewalls are aligned such that screws can be installed in these assembly holes without cross threading. As with the embodiments of FIGS. 3a-c, installation of screws in the aligned assembly holes 445a-b permanently attaches the left chassis module 405 to the right chassis module 410 via an offset lip joint.

In the embodiment of FIGS. 4a-b, a latch mechanism 415 is used to retain the alignment pin 425 of the right chassis module within the slot 430 cut from the sidewall of the of the left chassis module 405. The alignment pin 425 may be permanently fixed to the right chassis module 410 and may be positioned to align with the slot 430 of the left chassis module 405. As illustrated, the latch 415 may include an angled lower face that is configured to displace the latch 415 upwards into an open position as the alignment pin 425 is pushed towards the slot 430. As illustrated in FIG. 4a, the builder may push the right chassis module 410 against the left chassis module 405 such that the alignment pin 425 contacts the leading edge of the angled lower face of the latch 415 as it sits in a closed position. As the builder continues to push the two chassis modules 405 and 410 together, the alignment pin 425 slides along the angled lower face of the latch 415, thus causing the latch to pivot about its attachment point 450 to the left chassis module 405. This movement of the alignment pin 425 along the angled lower face of the latch 415 serves to raise the latch 415 into an open position, thus allowing alignment pin 425 to slide into a seated position in the slot 430 of the left chassis module 405.

As illustrated in FIG. 4b, the latch 415 drops back into a closed position after the alignment pin 425 has been pushed completely into a seated position within the slot 430 of the left chassis module 405. The pivoting of the latch 415 upwards into an open position to allow the alignment pin 425 to slide past may be resisted by a spring 420 that is attached to the latch 415. The resistive force of spring 420 pulls the latch 415 back down into its closed position after the alignment pin 425 has been pushed into its seated position within the slot 430. As illustrated, the spring 420 may be anchored by an attachment to the sidewall of the left chassis module 405. Other embodiments may utilize other mechanisms for generating a resistive force that maintains the latch 415 in a closed position.

In the locked position illustrated in FIG. 4b, the latch 415 provides a high resistance to movement by the alignment pin 425. The angled lower face of the latch 415 prevents the alignment pin from backing out of the slot 430 and keeps the alignment pin securely in its seated position. Even significant deviations in the flatness of an assembly table will not generate forces that can overcome the mechanical locking force provided by the closed latch 415. If required, the latch 415 may be manually raised in order to release the alignment pin 425 from its seated position in the slot 430. Utilizing the latching mechanism of FIGS. 4a-b, the left chassis module 405 and the right chassis module 410 may be aligned and locked in place until the two modules can be permanently fastened using screws.

Figure 5A:
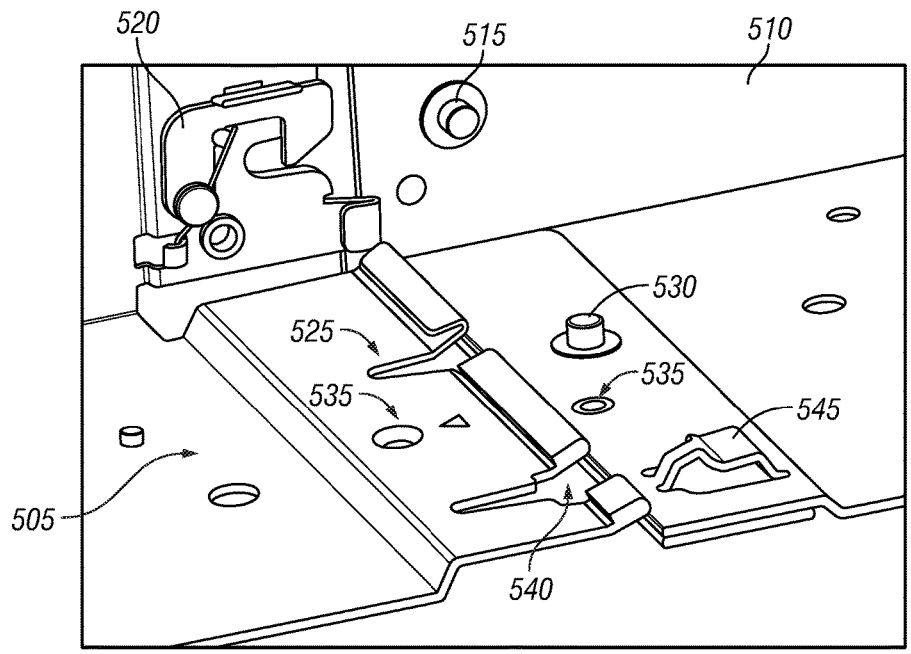
FIG. 5a is an illustration of modular chassis components in an un-assembled state, where the modular chassis components may utilize an alignment clip and alignment slot according to various embodiments.
Figure 5B:
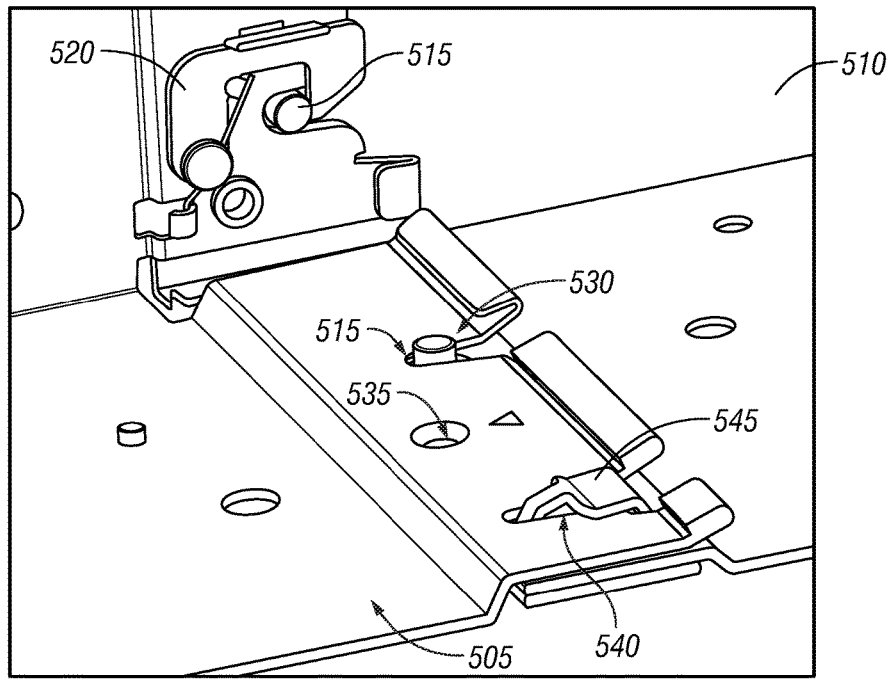
FIG. 5b is an illustration of a modular chassis components in an assembled state, where the modular chassis components are assembled using a modular chassis alignment clip mated with an alignment slot according to various embodiments.
Figure 5C:
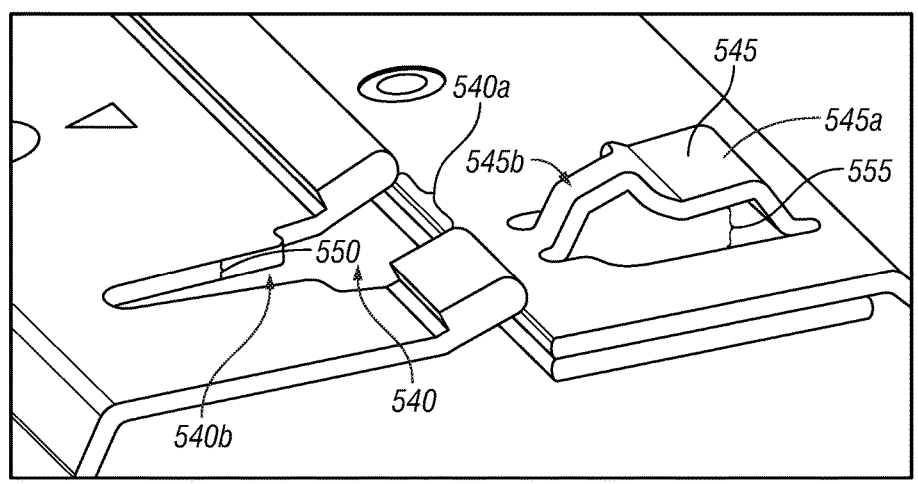
FIG. 5c is a magnified illustration of a modular chassis alignment clip and alignment slot according to various embodiments.

FIGS. 5a-c illustrate another embodiment that may be used to align and fasten two modular components of an IHS chassis together during the assembly process. In the embodiments of FIGS. 3a-c and FIGS. 4a-b, the modular chassis components are aligned and fastened via retaining mechanisms attached to the corresponding sidewalls of the two chassis components. In the embodiment of FIGS. 5a-c, the alignment features are located on the bottom surfaces of the left chassis module 505 and the right chassis module 510. As illustrated in FIG. 5a, the bottom surface of the left chassis module 505 includes an alignment slot 540 that corresponds to an alignment clip 545 on the bottom surface of the right chassis module 510. The left chassis module 505 and the right chassis module 510 may also include assembly holes 535 that receive screws that permanently fix the two chassis modules together along an offset lip joint that runs along the overlapping portion of the bottom surfaces of the two chassis modules.

As described, a builder may push the left chassis module 505 and the right chassis module 510 together during the assembly process. Any deflection along any portion of the bottom surfaces of the left chassis module 505 and the right chassis module 510 may result in these bottom surfaces becoming non-coplanar with respect to each other. In such scenarios, deflection in the bottom surfaces of the two chassis modules may result in misalignment of sidewall assembly holes 340a-b and 445a-b. In addition, any such non-coplanar deviations in the bottom surfaces of the two chassis modules may be exacerbated by any variations in the flatness of the assembly table on which the chassis is constructed. As before, misalignment along this bottom surface may result in slightly misaligned assembly holes 340a-b, 445a-b that may result in cross-threading.

As illustrated in FIG. 5b, the left chassis module 505 and the right chassis module 510 may be pushed together until the alignment clip 545 mates with the alignment slot 540. In this seated position of FIG. 5b, the assembly holes 340a-b, 445a-b, and 535 of the left chassis module 505 and the right chassis module 510 are aligned such that screws may be installed in the assembly holes without cross threading. The attachment of the screws in the assembly holes 535 permanently secures the offset lip joint along the bottom surface of the two chassis modules. As illustrated, the chassis module components may include additional alignment features along the edges of the bottom surfaces. For instance the right chassis module 510 includes an alignment pin 530 on the edge of the bottom surface that will form part of the offset lip joint. The left chassis module 505 includes a corresponding slot 525 that receives the alignment pin 530, thus further aligning the two chassis modules while they are pushed together during the assembly process.

FIG. 5c provides a close-up view of the alignment slot 540 and the alignment clip 545. The alignment slot 540 is formed from a notch 540a that is cut from the edge of the bottom surface of the left chassis module 505 and is further formed from an alignment channel 540b that extends from the notch 540a. As illustrated, the alignment channel is narrower than the alignment notch 540a. This configuration of the alignment slot 540 cut from the left chassis module 505 corresponds to the configuration of the alignment clip 545 of the right chassis module 510. More specifically, the alignment clip 545 is configured to slide into the alignment slot 540 as the left chassis module 505 and the right chassis module 510 are pushed together by a builder along the assembly table surface. As illustrated in FIG. 5b, the alignment clip 545 slides into the alignment slot 540 which serves to lock in place the offset lip joint that runs along the overlapping portions of the bottom surfaces of the two chassis modules. Locked in this position, the assembly holes 340a-b, 445a-b, 535 are aligned such that screws may be installed to permanently fix the two chassis modules along this bottom offset lip joint.

In the illustrated embodiments, the alignment clip 545 is formed from two raised arms, a guide arm 545b and a pinching arm 545a. The guide arm 545b is configured to slide into the alignment channel 540b of the alignment slot 540 as the two chassis modules are pushed together. The guide arm 545b of the alignment clip serves to align the two chassis modules with respect to lateral movement along the length of the offset lip joint that joins the bottom surfaces of the two chassis modules. When inserted into the alignment channel 540b, the guide arm 545b prevents movement between the two chassis modules along this lateral axis that runs the width of the two chassis components. As illustrated, the guide arm 545b extends upwards and is connected to the pinching arm 545a of the alignment clip.

The pinching arm 545a is configured to generate a clamping force that maintains coplanarity of the bottom surfaces of left chassis module 505 and the right chassis module 510, which thus prevents the two chassis module components from separating along the bottom surface. As previously described, keeping the bottom surfaces of the chassis modules aligned in a coplanar fashion serves to align assembly holes 340a-b, 445a-b. In the illustrated embodiment, the pinching arm 545a is raised from the bottom surface of the right chassis module such that a gap 555 remains below the pinching arm 545a. The size of the gap 555 is selected based on the thickness 550 of the sheet metal, or other material, from which the alignment slot 540 is cut from the left chassis module 505. In certain embodiments, the size of the gap 555 under the pinching arm 545a is slightly smaller than the thickness 550 of the alignment slot. Upon sliding of the alignment clip 545 into the alignment slot 540, portions of the pinching arm 545a slide over the chassis on each side of the alignment channel 540b, as illustrated in FIG. 5b. The alignment clip 545 may deflect upwards during this process in order for the gap 555 below the alignment clip to accommodate the thickness 550 of the alignment channel 540b. The alignment clip 545 may exert a clamping force that results in the pinching arm 545a generating a force that presses downwards along each side of the alignment channel 540b. This serves to further lock the two chassis modules in a state of coplanarity and thus prevents deflection of the two chassis module components along their bottom surfaces. In addition, the alignment of the bottom surfaces of the chassis modules using alignment clip 545 and alignment slot 540 serves to align the sidewall assembly holes 340a-b, 445a-b.

As illustrated in FIGS. 5a-b, the latch mechanism of FIGS. 4a-b may be utilized to lock the sidewalls of the two chassis modules together in conjunction with the use of the alignment slot 540 and alignment clip 545 along the bottom surface of the two chassis modules. In other embodiments, the retaining plate mechanism of FIGS. 3a-c may instead be utilized to lock the sidewalls of the two chassis modules together in conjunction with the use of the alignment slot 540 and the alignment clip 545. Other embodiments of the alignment slot 540 and alignment clip 545 may utilize other mechanism for locking the sidewalls of the two chassis components in place. In certain embodiments, the alignment slot 540 and alignment clip 545 may be utilized to align and lock two chassis modules in a coplanar configuration without utilizing either of the retaining plate mechanism of FIGS. 3-c or the latch mechanism of FIGS. 4a-b.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Also for purposes of this disclosure, computer-readable media may include any instrumentality or aggregation of instrumentalities that may retain data and/or instructions for a period of time. Computer-readable media may include, without limitation, storage media, e.g., a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory. Computer-readable media may also include optically readable barcodes (one or two-dimensional), plastic cards with embedded magnetic stripes, mechanically or optically read punched cards, or radio frequency identification tags.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An IHS (Information Handling Systems) constructed from a modular chassis, the IHS comprising:
   a first module of the modular chassis, wherein the first module comprises an alignment pin that is fixed to an overlap portion of the sidewall of the first module and that extends inwards into the modular chassis; and
   a second module of the modular chassis, wherein the second module comprises a first alignment slot cut from a recessed portion of the sidewall of the second module corresponding to the alignment pin, and wherein the second module further comprises a retaining mechanism that is fixed to the recessed portion of the sidewall of the second module, and wherein the retaining mechanism receives the alignment pin during assembly of the first module and the second module such that the overlap portion of the first module sidewall and the recessed portion of the second module sidewall are mated to form an overlapping joint between the first module and the second module, and wherein the retaining mechanism locks the alignment pin into a seated position in the first alignment slot.

2. The IHS of claim 1, wherein the locking of the alignment pin by the retaining mechanism aligns corresponding assembly holes in the overlap portion of the sidewall of the first module and the recessed portion of the sidewall of the second module.

3. The IHS of claim 2, wherein the locking of the alignment pin by the retaining mechanism allows the installation of fasteners in the aligned assembly holes of the overlapping joint between the first module and the second module.

4. The IHS of claim 1, wherein the retaining mechanism comprises a retaining plate that comprises a second alignment slot that corresponds with the first alignment slot, and wherein the retaining plate comprises upper and lower protrusions that extend into the second alignment slot.

5. The IHS of claim 4, wherein the upper and lower protrusions allow the alignment pin to be pushed into the seated position in the first alignment slot, and wherein the upper and lower protrusions lock the alignment pin in the seated position.

6. The IHS of claim 1, wherein the retaining mechanism comprises a latch that allows the alignment pin to be pushed into the seated position in the first alignment slot and locks the alignment pin in the seated position.

7. The IHS of claim 6, wherein the latch comprises an angled lower face that opens the latch as the alignment pin is pushed into the first alignment slot.

8. A modular chassis system:
   a first module comprising an alignment pin that is fixed to an overlap portion of the sidewall of the first module; and
   a second module comprising a first alignment slot cut from a recessed portion of the sidewall of the second module corresponding to the alignment pin, and wherein the second module further comprises a retaining mechanism that is fixed to the recessed portion of the sidewall of the second module, and wherein the retaining mechanism receives the alignment pin during assembly of the first module and the second module such that the overlap portion of the first module sidewall and the recessed portion of the second module sidewall are mated to form an overlapping joint between the first module and the second module, and wherein the retaining mechanism locks the alignment pin into a seated position in the first alignment slot.

9. The modular chassis system of claim 8, wherein the locking of the alignment pin by the retaining mechanism aligns corresponding assembly holes in the overlap portion of the sidewall of the first module and the recessed portion of the sidewall of the second module.

10. The modular chassis system of claim 9, wherein the locking of the alignment pin by the retaining mechanism allows the installation of fasteners in the aligned assembly holes of the overlapping joint between the first module and the second module.

11. The modular chassis system of claim 8, wherein the retaining mechanism comprises a retaining plate that comprises a second alignment slot that corresponds with the first alignment slot, and wherein the retaining plate comprises upper and lower protrusions that extend into the second alignment slot.

12. The modular chassis system of claim 11, wherein the upper and lower protrusions allow the alignment pin to be pushed into the seated position in the first alignment slot, and wherein the upper and lower protrusions lock the alignment pin in the seated position.

13. The modular chassis system of claim 8, wherein the retaining mechanism comprises a latch that allows the alignment pin to be pushed into the seated position in the first alignment slot and locks the alignment pin in the seated position.

14. The modular chassis system of claim 13, wherein the latch comprises an angled lower face that opens the latch as the alignment pin is pushed into the first alignment slot.

15. A method for assembly of an IHS (Information Handling Systems) constructed from a modular chassis, the method comprising:
    attaching a first module of the modular chassis to a second module of the modular chassis, wherein the first module comprises an alignment pin that is fixed to an overlap portion of the sidewall of the first module and that extends inwards into the modular chassis, and wherein the second module comprises a first alignment slot cut from a recessed portion of the sidewall of the second module corresponding to the alignment pin, and wherein the second module further comprises a retaining mechanism that is fixed to the recessed portion of the sidewall of the second module, and wherein the attaching comprises:

receiving, by the retaining mechanism, the alignment pin during assembly of the first module and the second module; and locking, by the retaining mechanism, the alignment pin into a seated position in the first alignment slot such that the overlap portion of the first module sidewall and the recessed portion of the second module sidewall are mated to form an overlapping joint between the first module and the second module.

16. The method of claim 15, wherein the locking of the alignment pin by the retaining mechanism aligns corresponding assembly holes in the overlap portion of the sidewall of the first module and the recessed portion of the sidewall of the second module, and wherein the locking of the alignment pin by the retaining mechanism allows the installation of fasteners in the aligned assembly holes of the overlapping joint between the first module and the second module.

17. The method of claim 15, wherein the retaining mechanism comprises a retaining plate that comprises a second alignment slot that corresponds with the first alignment slot, and wherein the retaining plate comprises upper and lower protrusions that extend into the second alignment slot.

18. The method of claim 17, wherein the upper and lower protrusions allow the alignment pin to be pushed into the seated position in the first alignment slot, and wherein the upper and lower protrusions lock the alignment pin in the seated position.

19. The method of claim 15, wherein the retaining mechanism comprises a latch that allows the alignment pin to be pushed into the seated position in the first alignment slot and locks the alignment pin in the seated position.

20. The method of claim 19, wherein the latch comprises an angled lower face that opens the latch as the alignment pin is pushed into the first alignment slot.

* * * * *